(12) United States Patent
Chang et al.

(10) Patent No.: US 7,871,892 B2
(45) Date of Patent: Jan. 18, 2011

(54) METHOD FOR FABRICATING BURIED CAPACITOR STRUCTURE

(75) Inventors: Chien-Wei Chang, Taoyuan (TW); Ting-Hao Lin, Taipei (TW); Ya-Hsiang Chen, Yun-Lin (TW); Yu-Te Lu, Taoyuan (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 114 days.

(21) Appl. No.: 12/479,811

(22) Filed: Jun. 7, 2009

(65) Prior Publication Data

US 2010/0307666 A1    Dec. 9, 2010

(51) Int. Cl.
*H01L 21/20* (2006.01)
(52) U.S. Cl. .................. 438/386; 438/238; 438/243; 438/253; 438/387; 438/393; 257/E21.602
(58) Field of Classification Search .............. None
See application file for complete search history.

(56) References Cited

U.S. PATENT DOCUMENTS

2009/0200638 A1* 8/2009 Smith ................... 257/532

* cited by examiner

*Primary Examiner*—N Drew Richards
*Assistant Examiner*—Kyoung Lee

(57) ABSTRACT

A method for fabricating a buried capacitor structure includes: laminating a first dielectric layer having a capacitor embedded therein with a second dielectric layer to bury the capacitor therebetween; forming a first circuit pattern on a first metal layer of the first dielectric layer and a second circuit pattern on a second metal layer of the second dielectric layer; depositing a first insulating layer and a second insulating layer on the first metal layer and the second metal layer, respectively; electrically connecting a positive electrode end and a negative electrode end of the capacitor to the second metal layer by a positive through-hole and a negative through-hole, thereby manufacturing the buried capacitor structure.

3 Claims, 5 Drawing Sheets

METHOD FOR FABRICATING BURIED CAPACITOR STRUCTURE

BACKGROUND OF THE INVENTION

1. Field of the Invention

The present invention generally relates to a method for fabricating a buried capacitor structure, and more particularly to a method for fabricating a structure with a capacitor buried in a circuit board.

2. The Prior Arts

Buried passives are passive components disposed between layers of a multi-layer circuit board. The electronic components, such as capacitors or resistors are directly formed on an inner layer of the circuit board by etching or printing. Then, at least one outer layer of the circuit board is laminated onto the inner circuit board to bury the electronic component inside the multi-layer circuit board. The buried passives are adapted to replace those discrete passives soldered to the circuit board, so as to free up space on the circuit board to pack more circuitry and active components.

Buried resistor technologies are first proposed by Ohmega Technologies, Inc., a manufacturer of OHMEGA-PLY® resistor-conductor material. The buried resistor is a thin film of a phosphorous-nickel alloy serving as a resistive element plated onto a matt side of a copper foil of an inner layer. Then, they are compressed to configure a thin core, and later processed by photo-resist processing twice and etching processing thrice, so as to configure a desired thin film resistor at a specific position. Such a thin film resistor is disposed between the layers, and thus called buried resistor.

Generally, a conventional capacitor structure includes a parallel plate capacitor, which has a source electrode and a ground electrode divided by a dielectric layer. Various approaches have been used to increase capacitance of the capacitor. Because capacitance of the capacitor is proportional to permittivity, one of the approaches is to provide the dielectric layer with a higher permittivity. Furthermore, capacitance of the capacitor increases with area and decreases with separation, and therefore another approach is to increase the area of the two electrodes and to decrease the distance between the two electrodes.

A conventional method for fabricating an embedded capacitor structure is illustrated in FIGS. 1 through 5. Referring to FIG. 1, a thin copper layer 4 is formed on a substrate 2, and then a patterned photo-resist layer 6 is formed on the thin copper layer 4 to expose a portion of the thin copper layer 4. Referring to FIG. 2, a comb-shaped electrode plate 10a is electroplated on the exposed portion of the thin copper layer 4, which is not covered by the photo-resist layer 6. Referring to FIG. 3, the comb-shaped electrode plate 10a includes a positive electrode 16 and a negative electrode 18. The positive electrode 16 includes a positive electrode end 12 and a plurality of positive comb branches 17, and the negative electrode 18 includes a negative electrode end 14 and a plurality of negative comb branches 19. The positive comb branches 17 and the negative comb branches 19 face each other and interleave without touching. The interleaving positive comb branches 17 and the negative comb branches 19 are parallel to each other, and keep a predetermined separation distance therebetween. Referring to FIG. 4, the photo-resist layer 6 is removed and a capacitor paste 15 is filled in a clearance between the positive electrode 16 and the negative electrode 18 to form a planar comb-type capacitor 10. Referring to FIG. 5, the capacitor 10, the thin copper layer 4 and the substrate 2 are laminated with a dielectric film 20 having a first metal layer 30. The capacitor 10 is embedded into a first surface of the dielectric film 20 and the first metal layer 30 is disposed on a second surface of the dielectric film 20. Then, the thin copper layer 4 and the substrate 2 are removed, thereby forming an embedded planar comb-type capacitor structure as shown in FIG. 5.

In the above-described configuration, parts of the positive electrode 16 and the negative electrode 18 are exposed on the first surface of the dielectric film 20, and thus electrical property of the capacitor 10 is affected by environmental factors. For example, high humidity can reduce breakdown voltage of the capacitor, and even damage the capacitor.

Hence, it is necessary to provide a method for fabricating a buried capacitor structure whose capacitor is insulated from environment and is not affected by environmental factors, and in the meanwhile has a smaller distance between the positive electrode and the negative electrode.

SUMMARY OF THE INVENTION

A primary objective of the present invention is to provide a method for fabricating a buried capacitor structure which overcomes the disadvantages of the conventional method. The solution of the presentation invention is to provide a method including: providing a first dielectric layer having an capacitor embedded therein and a first metal layer; providing a second dielectric layer having a second metal layer; laminating a second dielectric layer with the first dielectric layer to bury the capacitor therebetween; defining a through-hole through the first metal layer, the first dielectric layer, the second dielectric layer and the second metal layer; forming a positive through-hole and a negative through-hole through the second dielectric layer and the second metal layer; filling a metal material into the positive through-hole and the negative through-hole, thereby connecting a positive electrode end and a negative electrode end of the capacitor with the second metal layer; patterning the first metal layer and the second metal layer; and forming a first insulating layer and a second insulating layer on the first metal layer and the second metal layer, respectively. Therefore, the method for fabricating a buried capacitor structure according to the present invention improves Moreover, the buried capacitor structure may include a comb-type capacitor with high capacitance. Therefore, the method for fabricating a buried capacitor structure according to the present invention manufactures a buried capacitor structure whose capacitor is insulated from the environment, does not affected by environment factors and has a smaller distance between the positive electrode and the negative electrode. The capacitor structure is buried in the dielectric films for being insulated from environment, and thus is endurable and insensitive to environmental factors.

BRIEF DESCRIPTION OF THE DRAWING

The present invention will be apparent to those skilled in the art by reading the following detailed description of a preferred embodiment thereof, with reference to the attached drawings, in which.

DETAILED DESCRIPTION OF THE PREFERRED EMBODIMENT

Figure 6:
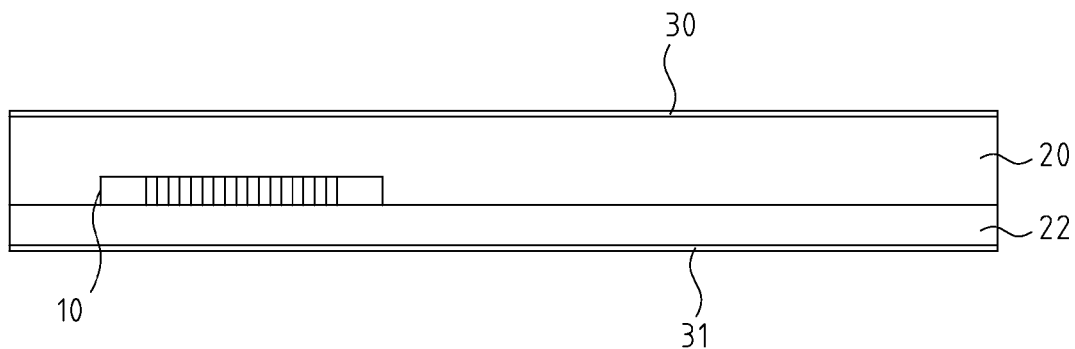
FIGS. 6 to 9 are schematic views illustrating a method for fabricating a buried capacitor structure according to the present invention.

FIGS. 6 to 9 are schematic view illustrating a method for fabricating a buried capacitor structure according to the present invention. Firstly, a first dielectric layer 20 is provided. The first dielectric layer 20 includes a first surface having a first metal layer 30 formed thereon and a second surface having a capacitor 10 embedded therein. A second dielectric layer 22 is provided. The second dielectric layer 22 includes a first surface having a second metal layer 31 deposited thereon and a second surface. Referring to FIG. 6, the second surface of the first dielectric layer 20 faces with the second surface of the second dielectric layer 22. As shown in FIG. 6, the first dielectric layer 20 having the first metal layer 30 and the capacitor 10 is laminated with the second dielectric layer 22 having the second metal layer 31, and the capacitor 10 is buried between the first dielectric layer 20 and the second dielectric layer 22.

Figure 7:
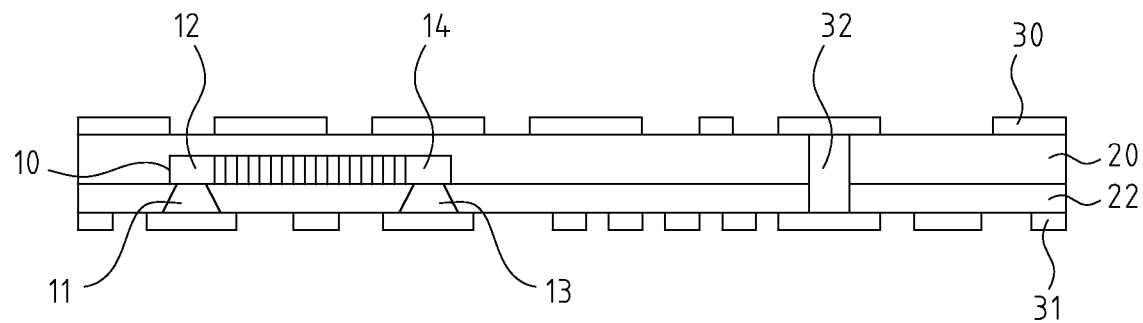

Secondly, referring to FIG. 7, a through-hole 32 is drilled by laser drilling or mechanical drilling to penetrate through the first metal layer 30, the first dielectric layer 20, the second dielectric layer 22 and the second metal layer 31. Similarly, a positive through-hole and a negative through-hole (not labeled) are drilled through the second metal layer 31 and the second dielectric layer 22 to reach a positive electrode end 12 and a negative electrode end 14 of the capacitor 10, respectively. A conductive metal material is filled into the through-hole 32 to electrically connect the first metal layer 30 with the second metal layer 31. The conductive metal material is also filled into the positive through-hole and the negative through-hole to form a positive lead 11 and a negative lead 13, and thus the positive electrode end 12 and the negative electrode end 14 are electrically connected with the second metal layer 31, respectively. After that, the first metal layer 30 formed on the first dielectric layer 20 is patterned to form a first circuit pattern, and the second conductive metal layer 31 formed on the second dielectric layer 22 is patterned to form a second circuit pattern.

Figure 8:
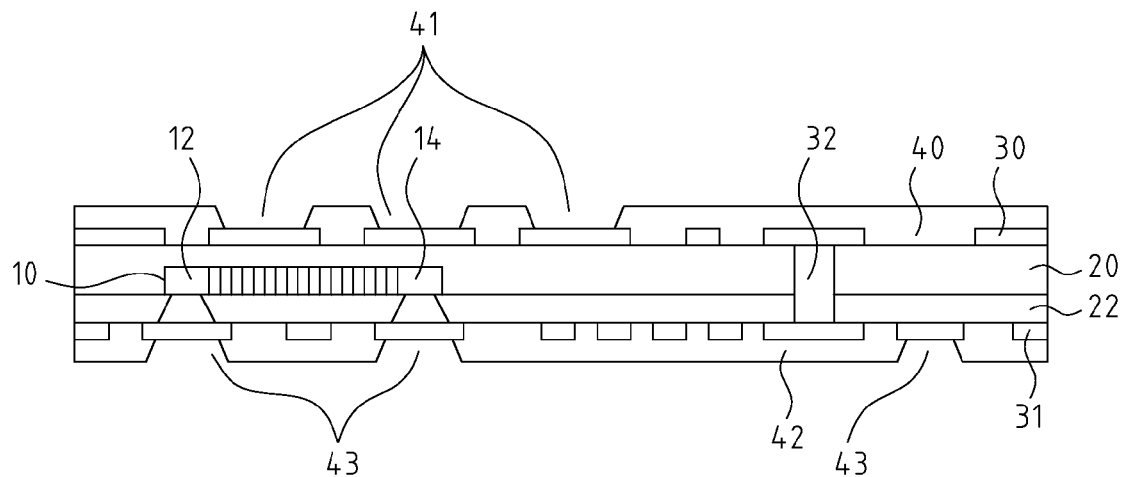

Thirdly, referring to FIG. 8, a first insulating layer 40 is deposited to cover the patterned first metal layer 30 and the exposed first dielectric layer 20, and a second insulating layer 42 is deposited to cover the patterned second metal layer 31 and the exposed second dielectric layer 22. The first insulating layer 40 and the second insulating layer 42 includes a plurality of first openings 41 and a plurality of second openings 43, respectively, so as to expose portions of the first circuit pattern of the first metal layer 30 and the second circuit pattern of the second metal layer 31, respectively.

Figure 9:
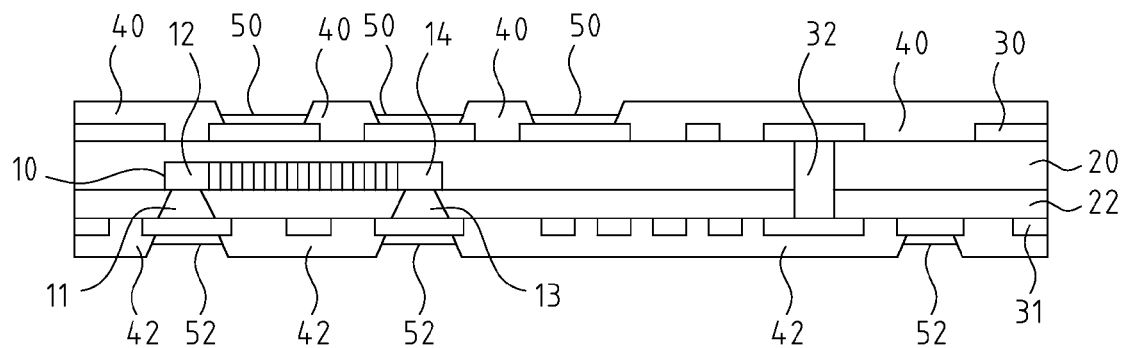

Finally, referring to FIGS. 8 and 9, a third metal layer 50 and a fourth metal layer 52 are deposited in the first openings 41 of the first insulating layer 40 and the second openings 43 of the second insulating layer 42, respectively. The third conductive metal layer 50 and the fourth conductive metal layer 52 serves as soldering layers for soldering electronic components, such as resistors, capacitors, inductors, diodes, transistors, switches and integrated circuits, etc.

Figure 1:
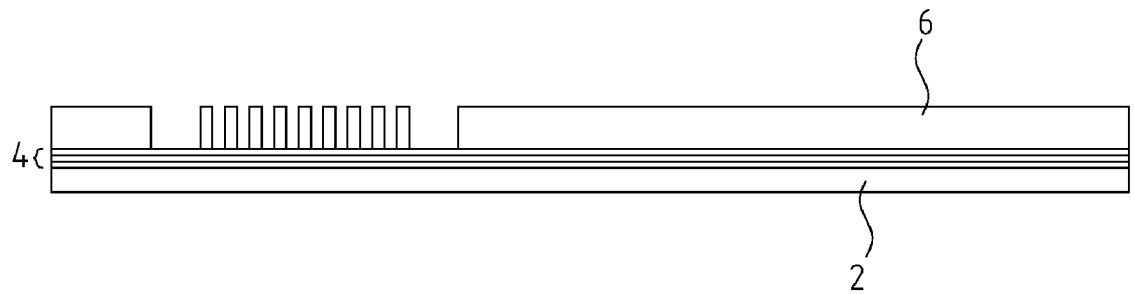
FIGS. 1 to 5 are schematic views illustrating a conventional method for fabricating an embedded capacitor structure.
Figure 2:
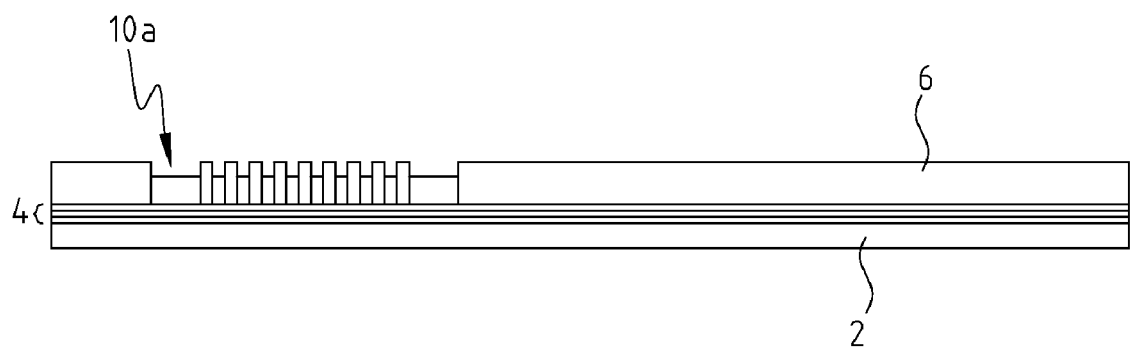
Figure 3:
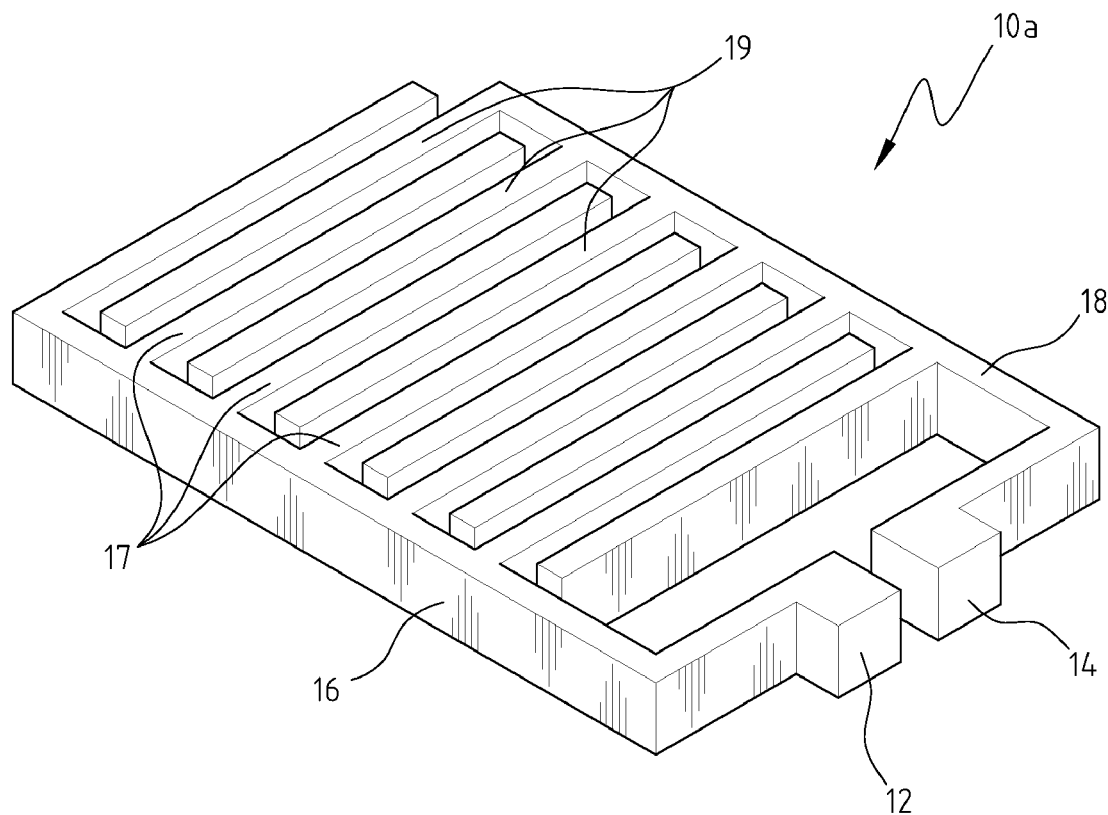
Figure 4:
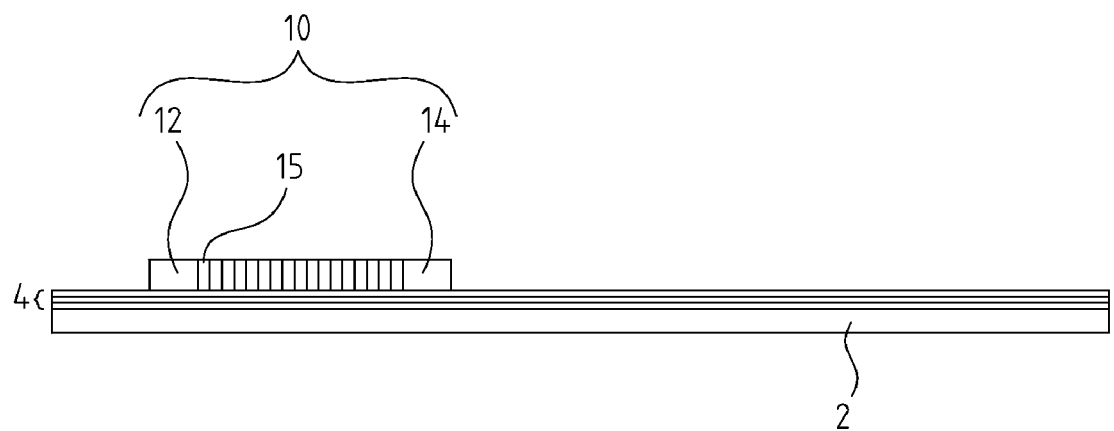
Figure 5:
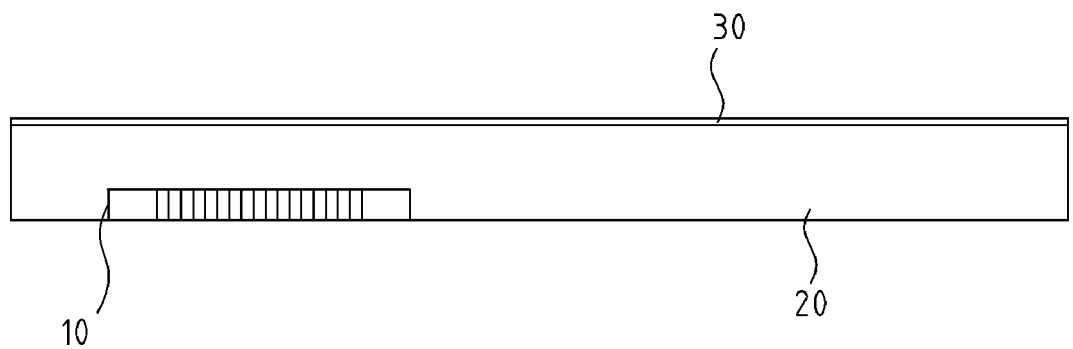

The capacitor 10 according to the present invention can be a planar comb-type capacitor 10a as shown in FIG. 3. Thus, it does not repeat to describe the capacitor. The advantage of the method according to the present invention is using a method for manufacturing a printed circuit board to fabricate a buried capacitor structure. The manufacture cost is down and reliability of the product is up.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A method for fabricating a buried capacitor structure, comprising:
    providing a first dielectric layer which includes a first surface having a first metal layer formed thereon and a second surface having a capacitor embedded therein, wherein the capacitor comprises a positive electrode having a positive electrode end and a negative electrode having a negative electrode end;
    providing a second dielectric layer which includes a first surface having a second metal layer formed thereon and a second surface;
    facing the second surface of the first dielectric layer with the second surface of the second dielectric layer, and laminating the first dielectric layer having the first metal layer and the capacitor with the second dielectric layer having the second metal layer, wherein the capacitor is buried between the first dielectric layer and the second dielectric layer;
    penetrating the first metal layer, the first dielectric layer, the second dielectric layer and the second metal layer to form a through-hole;
    penetrating the second metal layer and the second dielectric layer, and forming a positive through-hole and a negative through-hole to reach the positive electrode end and the negative electrode end, respectively;
    filling a metal material into the through-hole to electrically connect the first metal layer with the second metal layer, and filling a metal material into the positive through-hole and the negative through-hole to form a positive lead and a negative lead, respectively, wherein the positive lead electrically connects the positive electrode end with the second metal layer and the negative lead electrically connects the negative electrode end with the second metal layer;
    patterning the first metal layer and the second metal layer to form a first circuit pattern and a second circuit pattern, respectively;
    forming a first insulating layer on the patterned first metal layer and the exposed first dielectric layer, and forming a second insulating layer on the patterned second metal layer and the exposed second dielectric layer, wherein the first insulating layer includes a plurality of first openings to expose a portion of the first metal layer and the second insulating layer includes a plurality of second openings to expose a portion of the second metal layer; and
    forming a third metal layer in the first openings and forming a fourth metal layer in the second openings.

2. The method as claimed in claim 1, wherein the capacitor further comprises a capacitor paste filled between the positive electrode and the negative electrode, the capacitor paste prevents the positive electrode from contacting with the negative electrode, the positive electrode further includes a plurality of positive comb branches and the negative electrode further includes a plurality of negative comb branches, the positive comb branches and the negative comb branches interleave without touching each other, and the positive comb branches and the negative comb branches are parallel to each other and keep a predetermined separation distance therebetween.

3. The method as claimed in claim 2, wherein the capacitor paste is made of an insulating material.

* * * * *